US007574009B2

(12) United States Patent
Aubauer et al.

(10) Patent No.: US 7,574,009 B2
(45) Date of Patent: Aug. 11, 2009

(54) METHOD AND APPARATUS FOR CONTROLLING THE REPRODUCTION IN AUDIO SIGNALS IN ELECTROACOUSTIC CONVERTERS

(76) Inventors: Roland Aubauer, Wageneggerstr. 5, 81669 München (DE); Stefano Ambrosius Klinke, Im Erftgrund 22, 50169 Kerpen (DE)

( * ) Notice: Subject to any disclaimer, the term of this patent is extended or adjusted under 35 U.S.C. 154(b) by 526 days.

(21) Appl. No.: 10/490,259

(22) PCT Filed: Sep. 21, 2001

(86) PCT No.: PCT/DE01/03653

§ 371 (c)(1),
(2), (4) Date: Mar. 22, 2004

(87) PCT Pub. No.: WO03/028405

PCT Pub. Date: Apr. 3, 2003

(65) Prior Publication Data

US 2005/0002534 A1 Jan. 6, 2005

(51) Int. Cl.
*H03G 5/00* (2006.01)

(52) U.S. Cl. ........................................ 381/98; 381/321

(58) Field of Classification Search .................. 381/98, 381/1, 96, 102–103, 28, 109, 94.3, 120, 56, 381/61, 321; 330/151, 278
See application file for complete search history.

(56) References Cited

U.S. PATENT DOCUMENTS 4,454,609 A * 6/1984 Kates ......................... 381/320

(Continued)

FOREIGN PATENT DOCUMENTS

| | | |
|---|---|---|
| EP | 0 546 619 | 6/1993 |
| EP | 1 089 507 | 4/2001 |

(Continued)

OTHER PUBLICATIONS

Publication "Psychoakustik" von E. Zwicker, Springer-Velag 2$^{nd}$ Edition, 1999.

*Primary Examiner*—Vivian Chin
*Assistant Examiner*—Lun-See Lao
(74) *Attorney, Agent, or Firm*—Baker Botts L.L.P.

(57) ABSTRACT

The aim of the invention is to control the bass reproduction of audio signals in electroacoustic transducers based on the psychoacoustic principle denoted by the term "virtual pitch" or "residual hearing (hearing of missing fundamental)", in such a way that the perception of the virtual bass reproduction of the audio signals is improved in relation to prior art. To this end, the reproduction of the low pitched frequencies or basses released in the electroacoustic transducer is controlled by the amplification of the harmonic waves already contained in the audio signals, in the form of a simulation, in such a way that the listener experiences or perceives an improved bass reproduction. The control or simulation can thus be carried out in both a digital manner, by means of a program module in a digital signal processor of an electronic appliance for outputting and/or reproducing audio signals using the electroacoustic transducer, and in an analog manner, by means of a hardware circuit between a digital analog transducer and a final amplifier of the electronic appliance for outputting and/or reproducing audio signals using the electroacoustic transducer.

20 Claims, 6 Drawing Sheets

U.S. PATENT DOCUMENTS

| | | | | | |
|---|---|---|---|---|---|
| 5,661,808 | A | * | 8/1997 | Klayman | 381/1 |
| 5,930,373 | A | * | 7/1999 | Shashoua et al. | 381/98 |
| 6,072,885 | A | * | 6/2000 | Stockham et al. | 381/321 |
| 6,111,960 | A | * | 8/2000 | Aarts et al. | 381/61 |
| 6,885,752 | B1 | * | 4/2005 | Chabries et al. | 381/321 |

FOREIGN PATENT DOCUMENTS

| | | |
|---|---|---|
| FR | 2 403 684 | 4/1979 |
| WO | WO 00/15003 | 3/2000 |
| WO | WO 01/56157 | 8/2001 |

* cited by examiner

METHOD AND APPARATUS FOR CONTROLLING THE REPRODUCTION IN AUDIO SIGNALS IN ELECTROACOUSTIC CONVERTERS

BACKGROUND OF THE INVENTION

The bass reproduction of audio signals in an electroacoustic converter, particularly a loudspeaker or an earpiece, is governed by the size of the electroacoustic converter (the loudspeaker of the earpiece). The smaller the loudspeaker membrane and its maximum deflection area, the higher the lower resonant frequency.

FIG. 1 shows a typical frequency curve of a small loudspeaker. Electronic audio devices, in which such small electroacoustic converters are used and in which the base reproduction is consequently unsatisfactory, are primarily audio devices (devices for output or reproduction of audio signals) of communication and information technology as well as entertainment and consumer electronics, such as mobile radio and cordless handsets, notebooks, Personal Digital Assistants, mini radios, radio alarm clocks, portable music players, etc.

To improve the bass reproduction with a small loudspeaker, a known psychoacoustic principle can be employed. This principle is called "Residual Hearing" (Hearing of Missing Fundamentals) or "Virtual Pitch."

According to this principle, the perception of a basic frequency can be simulated by a combination of harmonic waves. Thus, the perception of a low frequency also can be simulated with the corresponding combination of its harmonic waves.

A more detailed description of the virtual pitch principle can be found in the publication "Psychoacoustics" by E. Zwicker; H. Fastl; Springer Verlag, 2nd. Edition, 1999.

Methods based on the psychoacoustic principle are known from U.S. Pat. Nos. 6,111,960 and 5,930,373, which use the audio signal to generate a corresponding series of harmonic waves to simulate the frequencies below the limit frequency.

From WO 00/15003, a method based on the psychoacoustic principle is known in which the harmonic waves present in the audio signal are amplified. In this case, to improve the bass reproduction of the audio signal, low-frequency components of the audio signal are isolated in electroacoustic converters into a low-frequency audio signal, the isolated low frequency components filtered with a number of bandpass filters, the bandpass-filtered frequency components amplified in an amplifier that can be controlled with regard to the gain factor, in which case the gain factor is obtained from the envelopes of the bandpass filtered frequency components, and a simulated low frequency audio signal is created by combining the original audio signal with the amplified frequency components.

An object of the present invention is to control the bass reproduction of audio signals in an electroacoustic converter based on the virtual pitch or residual hearing psychoacoustic principle in such a way that the perception of the virtual bass reproduction of the audio signals is improved compared to the prior art

SUMMARY OF THE INVENTION

Accordingly, the present invention consists of controlling the reproduction of the low frequencies or basses output in the electroacoustic converter through the amplification of harmonics already contained in the audio signal in the sense of a simulation so that the listener senses or perceives an improved bass reproduction. The control or simulation can be undertaken here both digitally, by a program module in the Digital Signal Processor DSP of the electronic device for output and/or reproduction of audio signals with the electroacoustic converter, as well as in an analog manner by a hardware circuit between the digital/analog converter and the output amplifier of the electronic device for output and/or reproduction of the audio signals with the electroacoustic converter.

With the program module and the hardware circuit only those harmonic waves which are above the resonant frequency of the electroacoustic converter, particularly of the loudspeaker, are amplified to simulate the perception of the basic frequency. The extraction or isolation of the harmonic waves is achieved in the program module by bandpass filtering and in the hardware circuit via a bandpass filter, whereas the amplification of the waves is controlled by a gain factor in the program module with software support and in the hardware circuit by a corresponding gain controlled amplifier designed for the task. The gain factor preferably is controlled by frequency components of the audio signal below the resonant frequency or limit frequency of the electroacoustic converter The advantage of the inventive method lies in the fact that the amplification of the harmonic original waves present in the audio signal guarantees a significantly better quality of the modified audio signals produced in the Digital Signal Processor. This particularly avoids distortions of the audio signal. In addition, the method in accordance with the present invention imposes lower requirements with regard to the computing power and the memory requirement in the Digital Signal Processor.

Thus, it is of advantage in accordance with another embodiment of the present invention if, when a "Finite Impulse Response" filter is—used, as opposed to an "Infinite Impulse Response" filter in accordance with—a further embodiment, for the audio signal to be combined with the amplified frequency components to be buffered in order to compensate for the combination of phase shifts based on the use of the FIR filter between the amplified frequency components and the audio signal.

In accordance with a further embodiment, it is advantageous if, to improve the quality of the modified audio signal output by the electroacoustic converters, the modified audio signal is filtered for amplification of selected frequencies.

Additional features and advantages of the present invention are described in, and will be apparent from, the following Detailed Description of the Invention and the Figures.

DETAILED DESCRIPTION OF THE INVENTION

Figure 1:
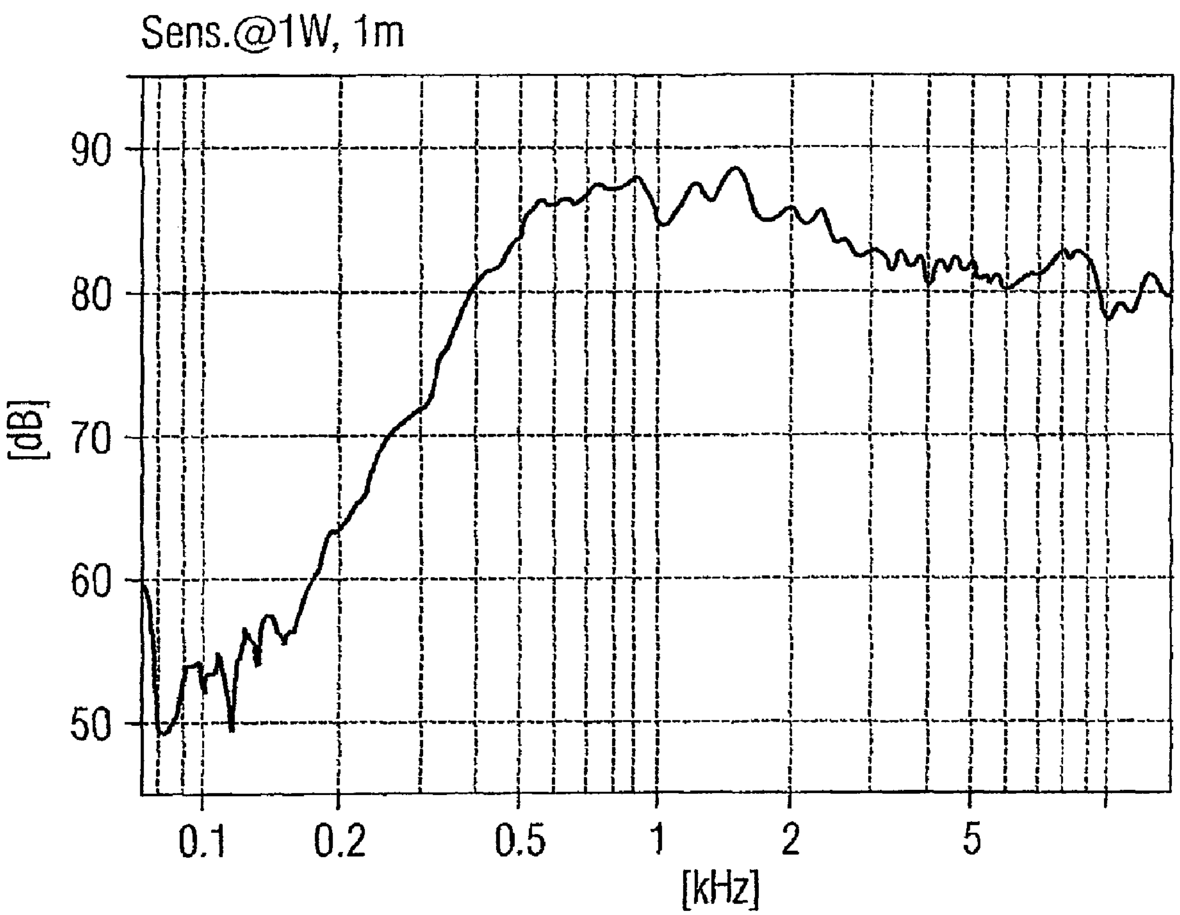
FIG. 1 shows a typical frequency curb of a small electroacoustic converter.
Figure 2:
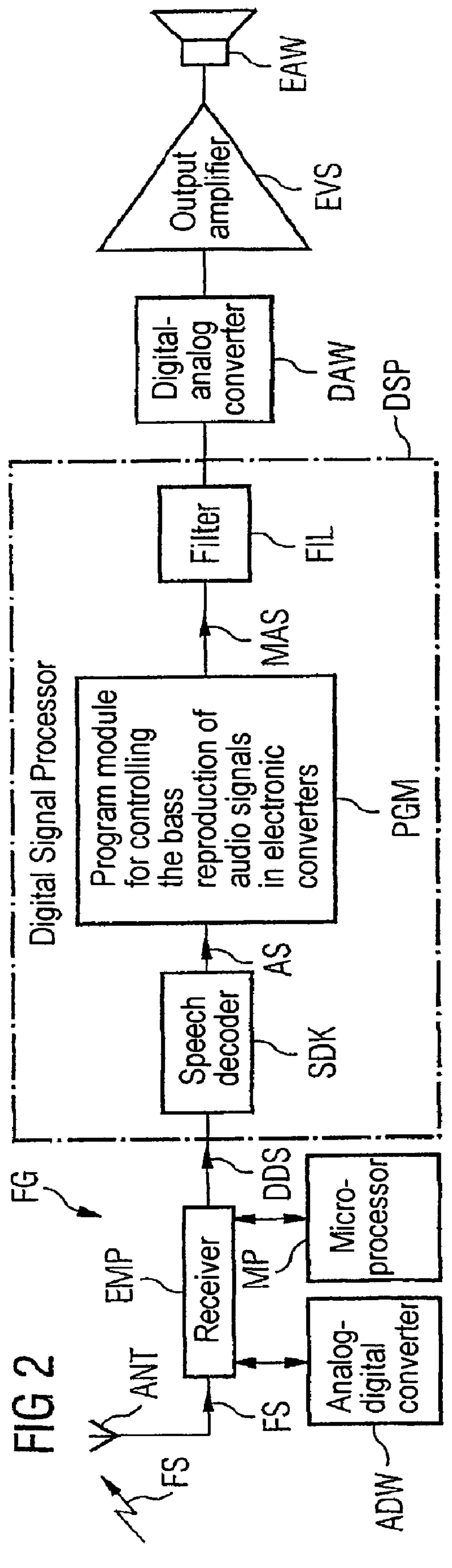
FIG. 2 shows the digital implementation of the method in accordance with the present invention in the form of a program module in a Digital Signal Processor of an electronic radio device for output and/or reproduction of audio signals.

FIG. 2 shows an exemplary embodiment in the form of a functional or block diagram of a speech processing link in a radio device FG for output and/or reproduction of audio signals, particularly speech signals, in which the present invention is implemented in a program module PGM of a Digital Signal Processor DSP (digital implementation). The radio device FG receives via an antenna ANT an analog radio signal FS on which encoded speech information is modulated. In a receiver EMP supported by a microprocessor MP and an analog/digital converter ADW, a digital demodulated signal DDS is generated from the analog radio signal FS. This digital demodulated signal DDS is then fed to a speech decoder SDK of the Digital Signal Processor DSP. In the speech decoder SDK, a speech signal—or, formulated in very general—terms, an audio signal AS is generated from the digital demodulated signal DDS. This audio signal AS is subsequently is fed to the program module for control of the bass reproduction of audio signals in electroacoustic converters PGM of the Digital Signal Processor DSP. In the program module PGM of the Digital Signal Processor DSP, a modified audio signal MAS is generated from the audio signal AS and is further filtered by a filter FIL of the Digital Signal Processor DSP. The filtered modified audio signal MAS is finally output to a digital-analog converter DAW and amplified in an output amplifier EVS before the speech information contained in the modified audio signal MAS is output by an electroacoustic converter EAS, which is preferably embodied as a loudspeaker.

Figure 3:
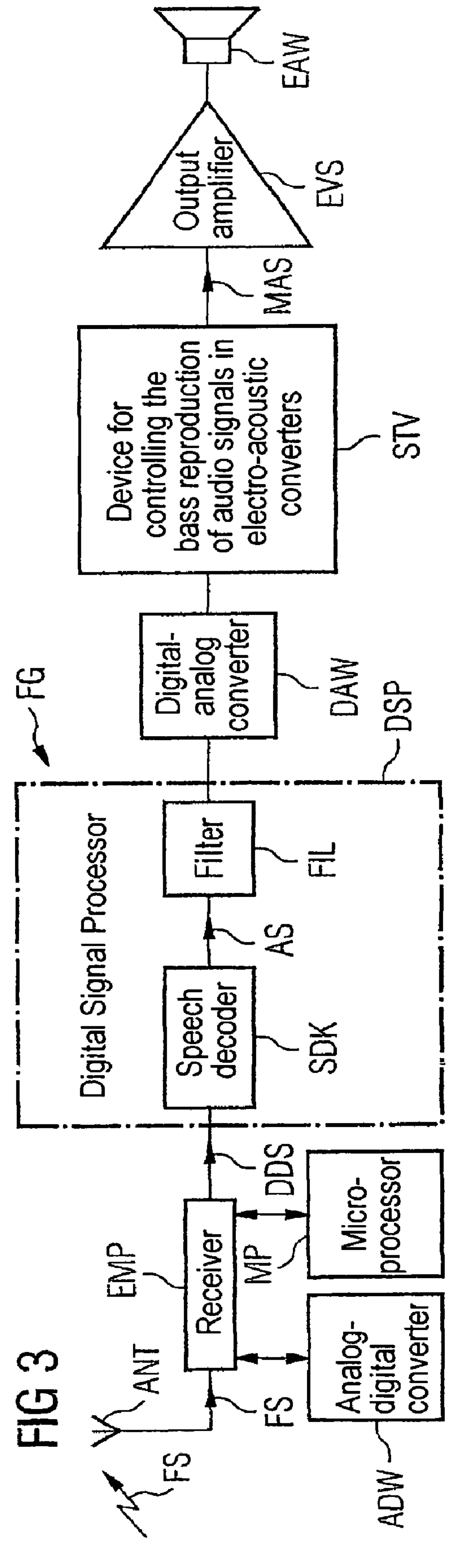
FIG. 3 shows the analog implementation of the device in accordance with the present invention in the hardware concept of an electronic radio device for output and reproduction of audio signals.

FIG. 3 shows a second exemplary embodiment in the form of a functional or block diagram of the speech processing link in a radio device FG, in which the present invention, in contrast to FIG. 2, is implemented outside the Digital Signal Processor DSP in the analog part of the radio device FG in a device for controlling the bass reproduction of audio signals in electroacoustic converters STV (analog implementation). The voice signal processing in a radio device FG again begins with the analog radio signal FS, onto which encoded speech information is modulated, being fed via the antenna ANT to the receiver EMP. In the receiver EMP, again supported by the microprocessor MP and the analog-digital converter ADW, the digital demodulated signal DSS is again generated from the analog radio signal FS. This digital demodulated signal DDS is again fed to the speech decoder SDK in the Digital Signal Processor DSP. In the speech decoder SDK, the decoded speech signal or, in very general terms, the decoded audio signal AS, is again obtained from the digital demodulated signal DDS. This audio signal AS is subsequently filtered in the filter FIL of the Digital Signal Processor DSP before the filtered audio signal is converted in the digital-analog converter DAW. The converted audio signal AS is subsequently fed to the device for controlling the bass reproduction of audio signals in electroacoustic converters STV where a modified audio signal MAS is generated from the audio signal AS. The modified audio signal MAS is then amplified in the output amplifier EVS before the speech information contained in the modified audio signal MAS is output via the electroacoustic converter EAW, which again is preferably embodied as a loudspeaker.

Figure 4:
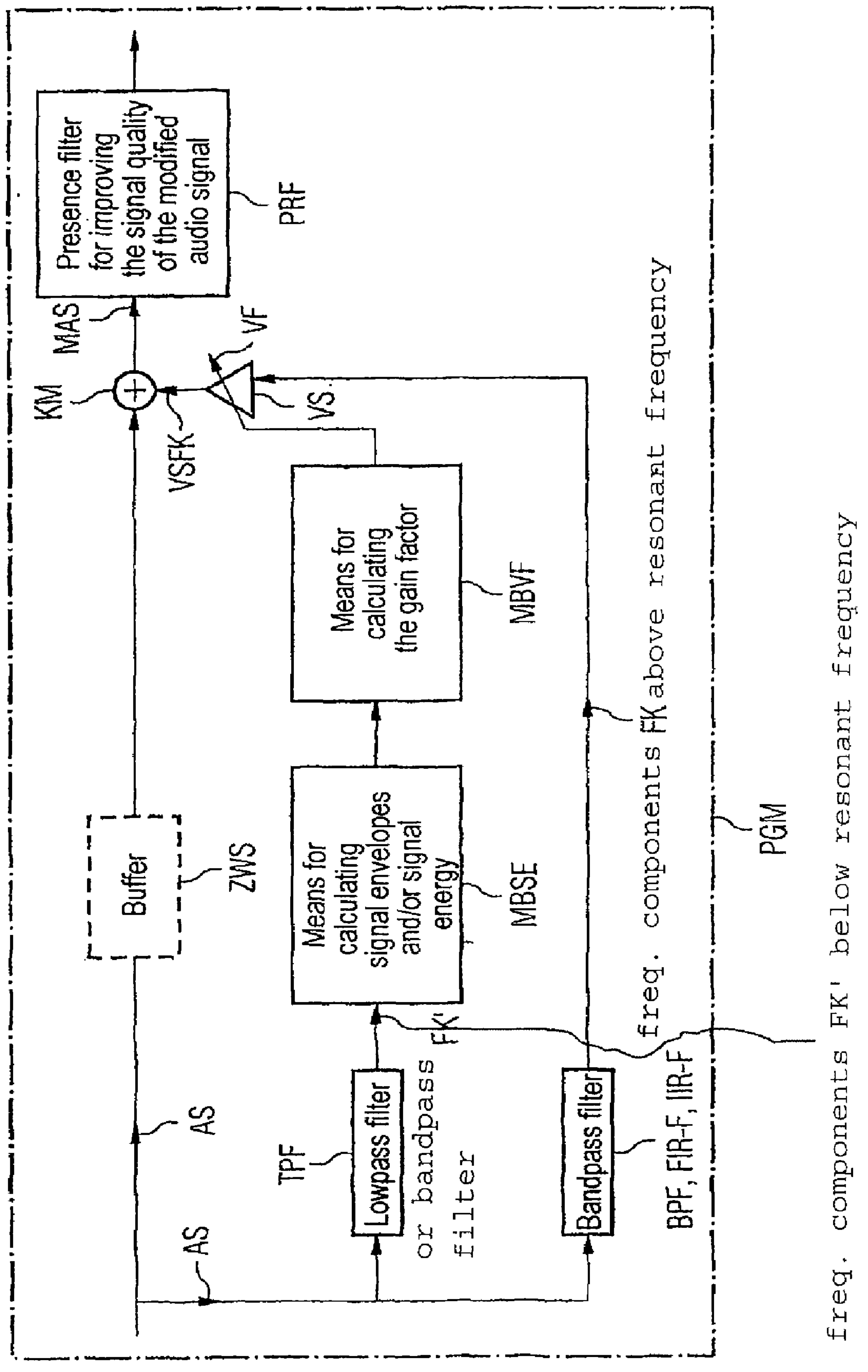
FIG. 4 shows a first embodiment of the program module in accordance with FIG. 2.

FIG. 4 shows a first embodiment of the program module PGM in accordance with FIG. 2. The audio signal AS is bandpass filtered using a bandpass filter implemented by software BPS to isolate a first frequency component FK, and is filtered via a low pass filter TPF implemented by software to isolate a second frequency component FK'. While the first frequency component FK is being amplified, a gain factor VF determined by the amplification of the first frequency component FK is generated with the second frequency component FK'.

Instead of the low pass filter TPF, a further bandpass filter implemented via software can be used as an alternative, or even the bandpass filter which the first frequency component FK generates. In the latter case, the two frequency components FK, FK' would be the same (FK=FK').

The bandpass filter BPF is preferably embodied as a Finite Impulse Response filter (FIR filter) FIR-F or, alternatively, as an Infinite Impulse Response filter (IIR filter) IIR-F. If the bandpass filter BPF is embodied as a Finite Impulse Response filter FIR-F, the program module PGM contains a buffer ZWS for buffering the audio signal AS. This buffer ZWS is not required if the bandpass filter BPF is embodied as an Infinite Impulse Response filter IIR-F. To represent this in FIG. 4, buffer ZWS is shown as a block with a dashed outline.

The bandpass filtered audio signal FK or the frequency component FK isolated with the bandpass filter BPF is applied for amplification to the input of an amplifier VS obtained via software and controllable with gain factor VF. To determine the gain factor VF, parts are provided in program module PGM via software for calculating the signal envelope and/or signal energy MBSE which, from the lowpass filtered audio signal FK supplied, an input variable or by software execution for calculating the gain factor MBVF of program module PGM. Calculator MBVF then delivers the gain factor VF with which the amplifier VS can be controlled. As such, at the output of amplifier VS there is an amplified bandpass filtered audio signal VSFK amplified by gain factor VF. This amplified bandpass filtered audio signal VSFK and the audio signal AS which, if necessary, also has been buffered are subsequently combined or added with the aid of combination part KM, preferably embodied as an additional process achieved via software. As a result of this operation, the modified audio signal MAS is produced which is preferably filtered to improve the signal quality with a presence filter PRF implemented via software. It is, however, also possible for the modified audio signal MAS, as explained in the description of FIG. 2, to be fed to the filter FIL without further filtering by the presence filter PRF.

Figure 5:
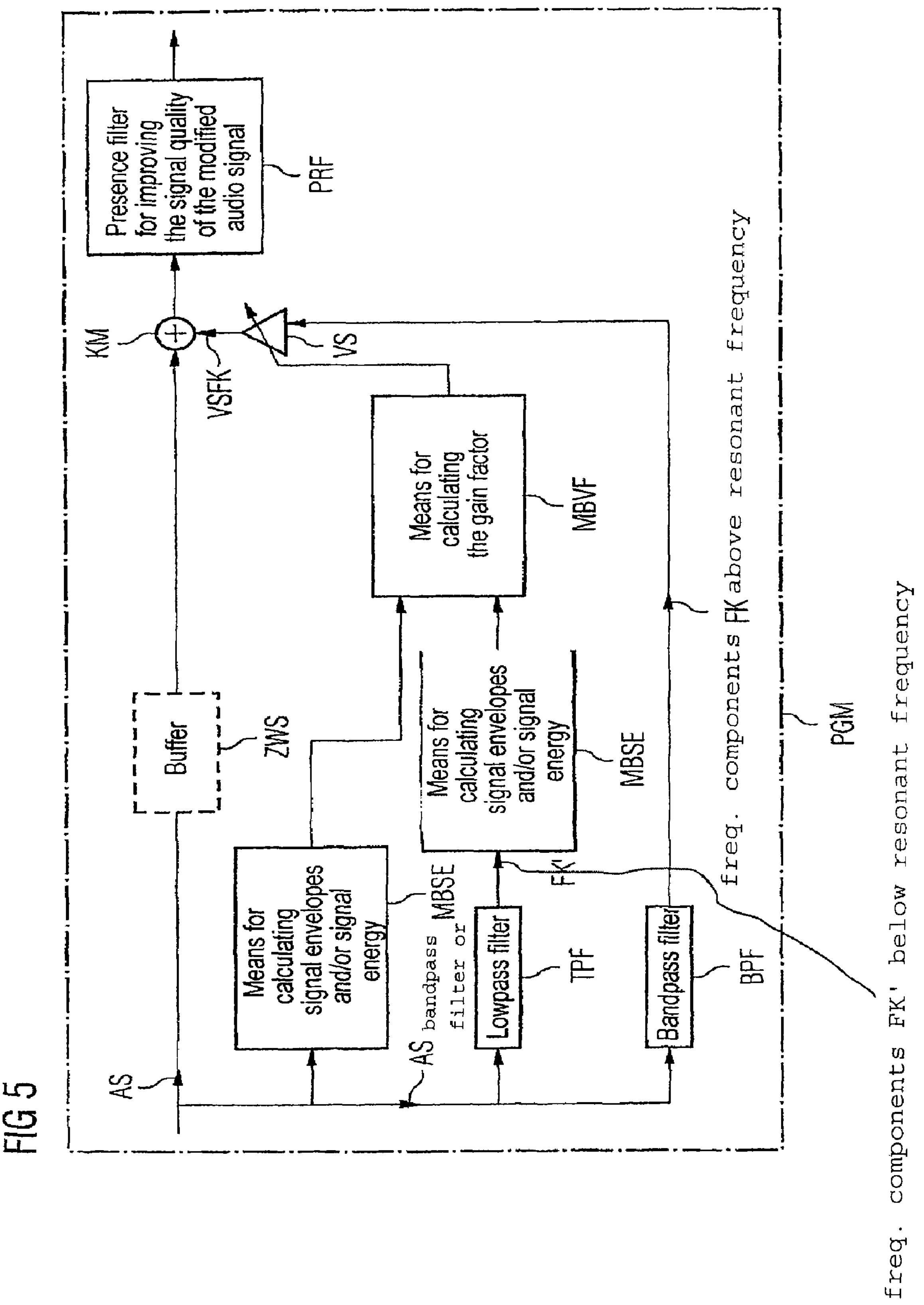
FIG. 5 shows a second embodiment of the program module in accordance with FIG. 2.

FIG. 5 uses FIG. 4 as a starting point to show a second embodiment of program module PGM in accordance with FIG. 2. The audio signal AS is again bandpass filtered with the bandpass filter BPF for isolation of the first frequency component FK and lowpass filtered with the lowpass filter TPF for isolation of the second frequency component FK'. While the first frequency components FK is again being amplified, a gain factor VF determined by the amplification of the first frequency component FK is again generated with the second frequency component FK'.

Instead of the lowpass filter TPF, a further bandpass filter implemented via software again can be used as an alternative, or even the bandpass filter which the first frequency component FK generates. In the latter case, the two frequency components FK, FK' would then again be the same (FK=FK').

The bandpass filter BPF is again preferably embodied as a Finite Impulse Response filter (FIR filter) FIR-F or, alternatively, as an Infinite Impulse Response filter (IIR filter) IIR-F. If the bandpass filter BPF is embodied as a Finite Impulse Response filter FIR-F, the program module PGM again contains the buffer ZWS for buffering the audio signal AS. This buffer ZWS again is not required if the bandpass filter BPF is embodied as an Infinite Impulse Response filter IIR-F. To represent this in FIG. 5, buffer ZWS is shown as a block with a dashed outline.

The bandpass filtered audio signal FK or the frequency component FK isolated with the bandpass filter BPF is applied as in FIG. 4 for amplification to the input of an amplifier VS achievable via software and controllable with gain factor VF. To determine the gain factor VF, parts are again provided in program module PGM via software for calculating the signal envelope and/or signal energy MBSE, which from the lowpass filtered audio signal FK' supplies an input variable or software processes are provided for calculating the gain factor MBVF of program module PGM.

In the embodiment of program module PGM in accordance with FIG. 5, unlike that shown in FIG. 4, a further input variable is fed to calculator MBVF which originates from further parts for calculating the signal envelope and/or signal energy MBSE. The further input variable is calculated by the calculator MBSE from the unfiltered audio signal AS.

MBVF then delivers the gain factor VF with which the amplifier VS can again be controlled from these two input variables. As such, at the output of amplifier VS there is again an amplified bandpass filtered audio signal VSFK amplified by gain factor VF. This amplified bandpass filtered audio signal VSFK and the audio signal AS which, if necessary has been buffered are again combined or added with the aid of combination parts KM of program module PGM, preferably again via software. As a result of this operation, the modified audio signal MAS is produced which is preferably filtered to improve the signal quality with the presence filter PRF implemented via software. It is, however, also possible for the modified audio signal MAS, as explained in the description of FIG. 2, to be fed to the filter FIL without further filtering by the presence filter PRF.

Figure 6:
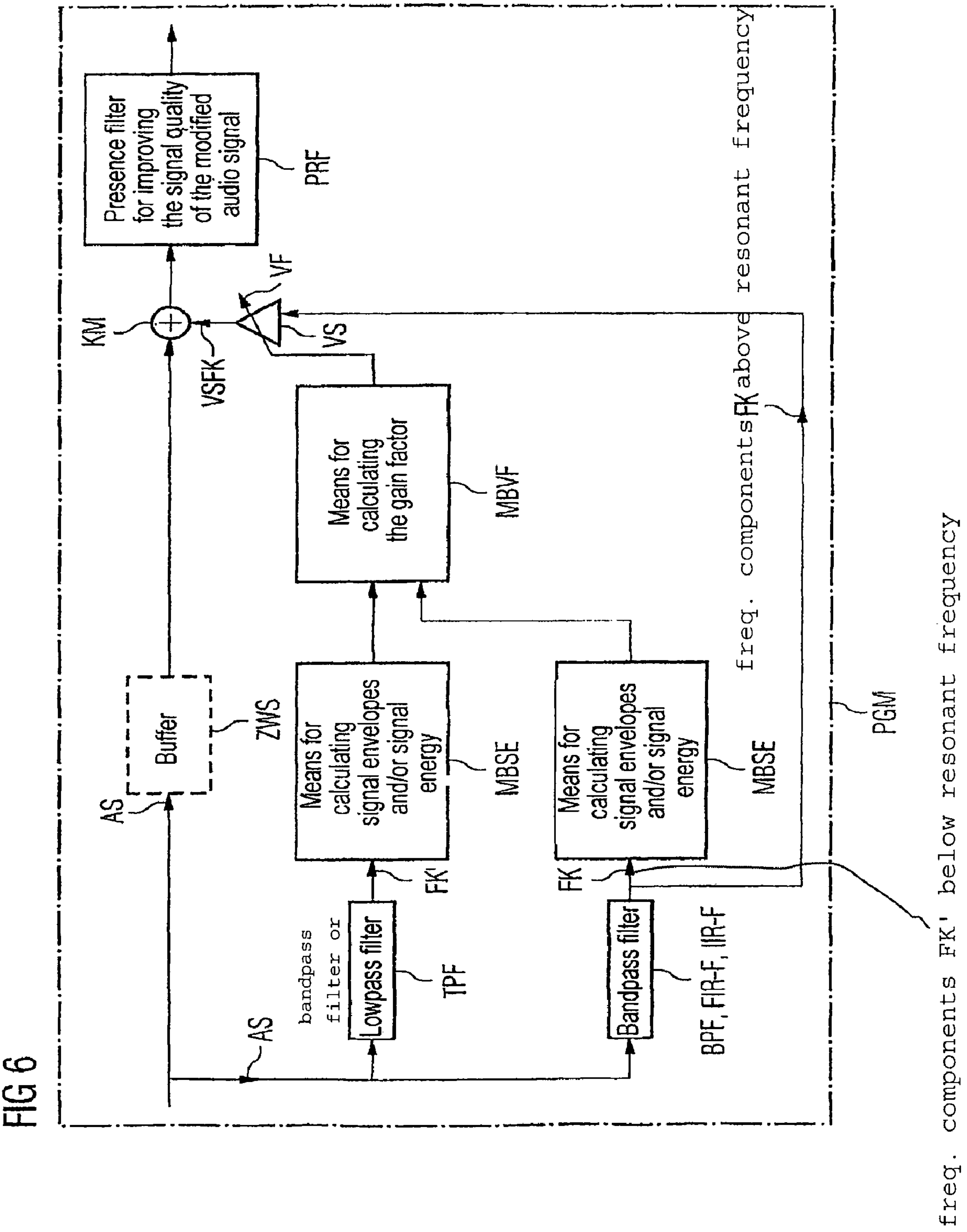
FIG. 6 shows a third embodiment of the program module in accordance with FIG. 2.

FIG. 6 uses FIG. 4 as a starting point to show a third embodiment of program module PGM in accordance with FIG. 2. The audio signal AS is once more bandpass filtered with the bandpass filter BPF for isolation of the first frequency component FK and low pass filtered with the low pass filter TPF for isolation of the second frequency component FK'. While the first frequency component FK is being amplified, a gain factor VF determined by the amplification of the first frequency component FK is once again generated with the second frequency component FK'.

Instead of the lowpass filter TPF, a further bandpass filter implemented via software again can be used as an alternative, or even the bandpass filter which the first frequency component FK generates. In the latter case, the two frequency components FK, FK' would be the same (FK=FK').

The bandpass filter BPF is once more preferably embodied as a Finite Impulse Response filter (FIR filter) FIR-F or, alternatively, as an Infinite Impulse Response filter (IIR filter) IIR-F. If the bandpass filter BPF is embodied as a Finite Impulse Response filter FIR-F, the program module PGM once more contains the buffer ZWS for buffering the audio signal AS. This buffer ZWS is once more not required if the bandpass filter BPF is embodied as an Infinite Impulse Response filter IIR-F. To represent this in FIG. 6, buffer ZWS is shown as a block with a dashed outline.

The bandpass filtered audio signal FK or the frequency component FK isolated with the bandpass filter BPF is applied as in FIGS. 4 and 5 for amplification to the input of the amplifier VS achieved via software and controllable with gain factor VF. To determine the gain factor VF, parts are once more provided in program module PGM via software for calculating the signal envelope and/or signal energy MBSE, which from the lowpass filtered audio signal FK' supplies an input variable or via software for calculating the gain factor MBVF of program module PGM.

In the embodiment of program module PGM in accordance with FIG. 6, unlike that shown in FIG. 4, a further input variable is fed to calculator MBVF which originates from further calculator MBSE. The further input variable, unlike the variable in accordance with FIG. 5, is calculated by calculator MBSE from the bandpass-filtered audio signal FK.

Calculator MBVF then delivers the gain factor VF, with which the amplifier VS can be controlled, from these two input variables. As such, at the output of amplifier VS, there is once more an amplified bandpass filtered audio signal VSFK amplified by gain factor VF. This amplified bandpass filtered audio signal VSFK and the audio signal AS which, if necessary, also has been buffered are subsequently once more combined or added with the aid of combination parts KM of program module PGM, preferably again via software. As a result of this operation, the modified audio signal MAS is once more produced, and preferably is once more filtered to improve the signal quality with the presence filter PRF implemented via software. It also is, however, once more possible for the modified audio signal MAS, as explained in the description of FIG. 2, to be fed to the filter FIL without further filtering by the presence filter PRF.

Figure 7:
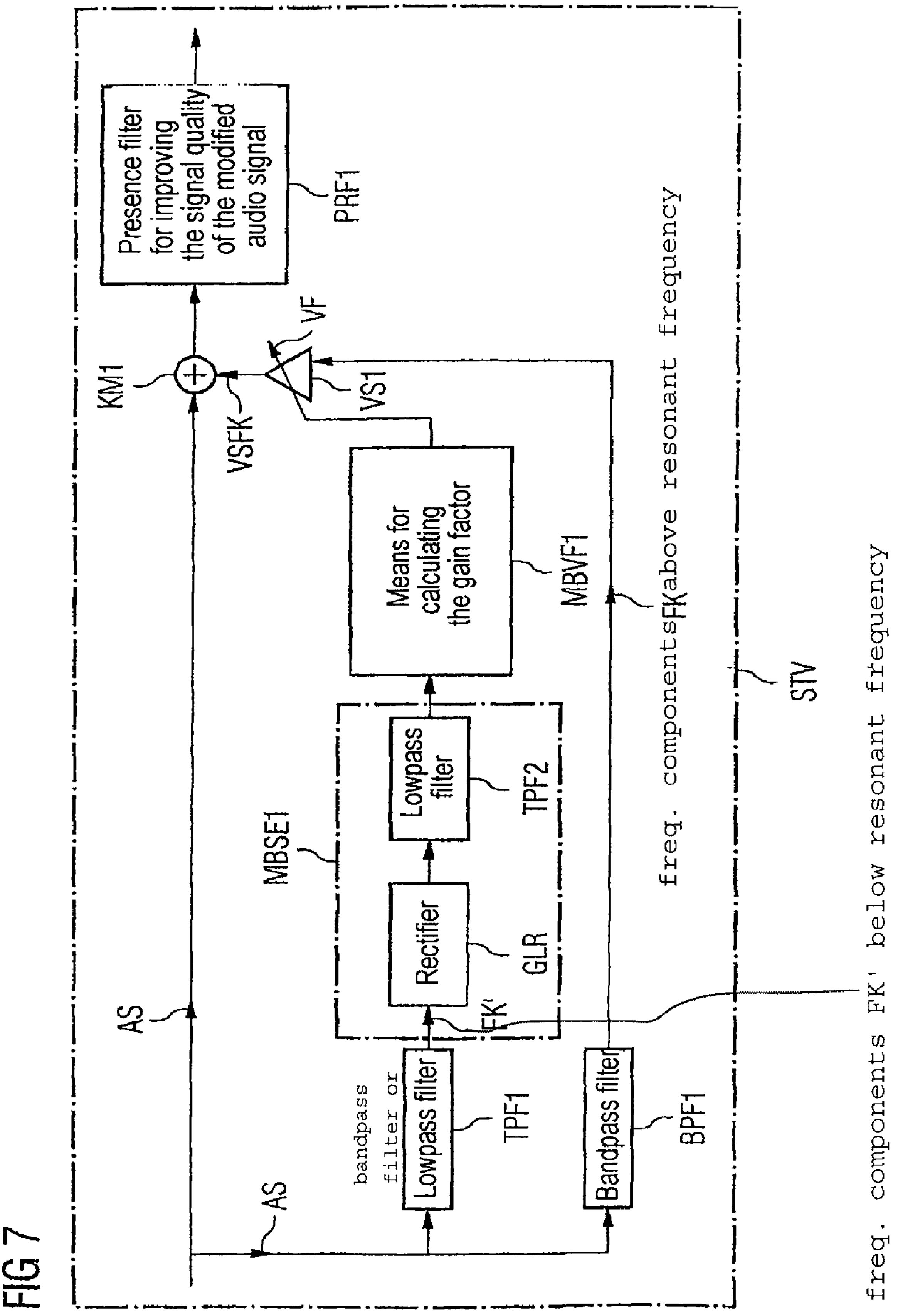
FIG. 7 shows an embodiment of the control device in accordance with FIG. 3.

FIG. 7 shows an embodiment of the control device STV in accordance with FIG. 3. The audio signal AS is bandpass filtered with the bandpass filter BPF1 embodied as a hardware chip for isolation of the first frequency component FK and lowpass filtered with the low pass filter TPF1 embodied as a hardware chip for isolation of the second frequency component FK'. While the first frequency component FK is being amplified, a gain factor VF determined by the amplification of the first frequency component FK is once again generated with the second frequency component FK'.

Instead of the low pass filter TPF1, a further bandpass filter embodied as a hardware chip also can be used as an alternative, or even the bandpass filter BPF1 which the first frequency component FK generates. In the latter case, the two frequency components FK, FK' would be the same (FK=FK').

The bandpass filtered audio signal FK or the frequency component FK isolated with the bandpass filter BPF1 is applied for amplification to the input of an amplifier VS1 embodied as a hardware chip and controllable with gain factor VF. To determine the gain factor VF, there are parts in the control device STV embodied as a hardware chip for calculating signal envelope and/or signal energy MBSE1, which preferably consist of the series circuit of a rectifier GLR and a further lowpass filter TPF2, and which from the lowpass filtered audio signal FK' deliver an input variable to a hardware chip for calculating the gain factor MBVF1 of the control device STV. The calculator MBVF then delivers the gain factor VF with which the amplifier VS can be controlled. As such, at the output of amplifier VS1, there is an amplified bandpass-filtered audio signal VSFK amplified by gain factor VF. This amplified band pass filtered audio signal VSFK and the audio signal AS are subsequently combined or added with the aid of combination parts KM1 of control device STV, preferably embodied as a hardware chip. As a result of this operation, the modified audio signal MAS is produced which is preferably filtered to improve the signal quality with a presence filter PRF1 implemented as a hardware chip. It is, however, also possible for the modified audio signal MAS, as explained in the description of FIG. 3, to be fed to the output amplifier EVS without further filtering by the presence filter PRF.

Indeed, although the present invention has been described with reference to specific embodiments, those of skill in the art will recognize that changes may be made thereto without departing from the spirit and scope of the present invention s set forth in the hereafter appended claims.

The invention claimed is:

1. A method for controlling bass reproduction of an audio signal in an electroacoustic converter having a resonance frequency, the method comprising the steps of:

isolating and amplifying first frequency components of the audio signal with a gain factor which is calculated based on the audio signal;

combining the audio signal and the amplified first frequency components of the audio signal to produce a modified audio signal; and feeding the modified audio signal to the electroacoustic converter;

wherein the audio signal is bandpass filtered for isolation such that the first frequency components are above the resonant frequency of the electroacoustic converter and wherein said first frequency components are amplified with a gain factor, wherein the gain factor is controlled by second frequency components of the audio signal, wherein the second frequency components are below said resonant frequency and by at least one of an envelope and an energy of said second frequency components.

2. A method for controlling bass reproduction of an audio signal in an electroacoustic converter as claimed in claim 1, wherein bandpass filtering is effected using a Finite Impulse Response filter.

3. A method for controlling bass reproduction of an audio signal in an electroacoustic converter as claimed in claim 1, wherein bandpass filtering is effected using an Infinite Impulse Response filter.

4. A method for controlling bass reproduction of an audio signal in an electroacoustic converter as claimed in claim 2, wherein the audio signal to be combined with the amplified first frequency components is buffered.

5. A method for controlling bass reproduction of an audio signal in an electroacoustic converter as claimed in claim 1, wherein the modified audio signal is filtered for amplification of selected frequencies.

6. A method for controlling bass reproduction of an audio signal in an electroacoustic converter as claimed in claim 1, wherein the method is performed in an electronic device for at least one of output and reproduction of audio signals.

7. An apparatus for controlling bass reproduction of an audio signal in an electroacoustic converter having a resonance frequency, comprising:

at least one first bandpass filter receiving said audio signal and being operable to isolate first frequency components of said audio signal being above said resonance frequency, and a second filter receiving said audio signal and being operable to isolate second frequency components of said audio signal and being below said resonance frequency;

a first calculation part for calculating of a signal envelope and a signal energy, said first calculation part for receiving said second frequency components;

a second calculation part for calculating a gain factor, at an input of which is connected the first calculation part;

an amplifier connected to said at least one first bandpass filter and the second calculation part for amplifying the first frequency components of the audio signal with the calculated gain factor, wherein the at least one first bandpass filter is connected on an output side with the amplifier; and a combination part, at an input of which the audio signal and the amplified first frequency components of the audio signal are present, for combining the audio signal and the amplified first frequency components of the audio signal to produce, at an output of the combination part, a modified audio signal for the electroacoustic converter.

8. An apparatus for controlling bass reproduction in an electroacoustic converter as claimed in claim 7, further comprising a presence filter for amplifying selected frequencies of the modified audio signal.

9. An apparatus for controlling bass reproduction in an electroacoustic converter as claimed in claim 7, wherein the apparatus is integrated in an electronic device for at least one of output and reproduction of audio signals.

10. A system for controlling bass reproduction of an audio signal in an electroacoustic converter, comprising:

an electroacoustic converter having a resonance frequency;

a first bandpass filter receiving said audio signal and being operable to isolate or extract harmonic waves of said audio above said resonance frequency;

a second filter generating an output signal having frequency components of the audio signal below said resonance frequency;

means for generating a gain factor from an output signal of said second filter;

a gain controllable amplifier receiving an output signal of said first bandpass filter and a gain control signal from said means for generating a gain factor;

an adder for adding the audio signal and an output signal of said gain controllable amplifier to generate a signal which is fed to said electroacoustic converter.

11. The system according to claim 10, wherein said first bandpass and said second filter are realized by one of a Finite Impulse Response filter or a Infinite Impulse Response filter.

12. The system according to claim 10, wherein the second filter is a low pass filter or a bandpass filter.

13. The system according to claim 10, further comprising a buffer for buffering the audio signal fed to said adder.

14. The system according to claim 10, wherein the means for generating a gain factor comprise:

first means for calculating signal envelopes and/or signal energy receiving said output signal of said second filter;

means for calculating the gain factor coupled with said means for calculating signal envelopes and/or signal energy.

15. The system according to claim 14, further comprising second means for calculating signal envelopes and/or signal energy receiving said audio signal and generating an output signal fed to said means for calculating the gain factor.

16. The system according to claim 14, further comprising third means for calculating signal envelopes and/or signal energy receiving the output signal of said first bandpass and generating an output signal fed to said means for calculating the gain factor.

17. The system according to claim 14, wherein said first means for calculating signal envelopes and/or signal energy comprise a rectifier followed by a lowpass filter.

18. The system according to claim 15, wherein said second means for calculating signal envelopes and/or signal energy comprise a rectifier followed by a lowpass filter.

19. The system according to claim 16, wherein said third means for calculating signal envelopes and/or signal energy comprise a rectifier followed by a lowpass filter.

20. The system according to claim 10, further comprising a presence filter for amplifying selected frequencies of the output signal of said adder.

* * * * *